United States Patent
Porcu et al.

(10) Patent No.: US 7,307,408 B2
(45) Date of Patent: Dec. 11, 2007

(54) CABLE LOCATING DEVICE

(76) Inventors: Gregory Porcu, P.O. Box 721611, Pinon Hills, CA (US) 92372; Gabriel Porcu, 5652 Durango Rd., Riverside, CA (US) 92506

( * ) Notice: Subject to any disclaimer, the term of this patent is extended or adjusted under 35 U.S.C. 154(b) by 0 days.

(21) Appl. No.: 11/417,068

(22) Filed: May 3, 2006

(65) Prior Publication Data

US 2006/0255788 A1    Nov. 16, 2006

Related U.S. Application Data

(60) Provisional application No. 60/679,071, filed on May 9, 2005.

(51) Int. Cl.
 *G01R 19/00* (2006.01)
 *G01R 31/00* (2006.01)
(52) U.S. Cl. .................. 324/66; 324/508; 324/713
(58) Field of Classification Search .......... 324/66, 324/713, 208
 See application file for complete search history.

(56) References Cited

U.S. PATENT DOCUMENTS

| | | | |
|---|---|---|---|
| 1,738,710 A | 12/1929 | Jones | |
| 3,052,842 A | 9/1962 | Frohman et al. | |
| 3,440,531 A | 4/1969 | Josorka et al. | |
| 3,867,692 A | 2/1975 | Esch | |
| 4,429,274 A | 1/1984 | Hamblen | |
| 4,652,813 A | 3/1987 | Bakke et al. | |
| 5,764,043 A | 6/1998 | Czosnowski et al. | |
| 5,847,557 A | 12/1998 | Fincher et al. | |
| 6,323,652 B1 * | 11/2001 | Collier et al. | 324/508 |
| 6,705,884 B1 * | 3/2004 | McCarthy | 439/394 |
| 6,750,643 B2 * | 6/2004 | Hwang et al. | 324/66 |
| 6,900,629 B2 | 5/2005 | Hwang et al. | |
| 7,057,401 B2 * | 6/2006 | Blades | 324/713 |
| 2005/0052174 A1 | 3/2005 | Angelo et al. | |

* cited by examiner

*Primary Examiner*—Walter Benson
*Assistant Examiner*—John Zhu
(74) *Attorney, Agent, or Firm*—Donn K. Harms

(57) ABSTRACT

A device for identifying individual cables communicating between many remote locations to one central location using the building AC ground circuit to communicate between the remote location and the central location. The device includes a plurality of tubes adapted to engage individual cables and corresponding light-emitting diodes (LED) adjacent to each tube. A needle in the tube provides communication with the wire of the insulated cable. A remote interconnection cable provides connection between cable remote ends, and the building ground circuit concurrently providing a means to prevent engagement with the energized AC circuits.

21 Claims, 3 Drawing Sheets

CABLE LOCATING DEVICE

PRIORITY

This application claims the benefit of U.S. Provisional Application Ser. No. 60/679,071, filed on May 9, 2005.

BACKGROUND OF THE INVENTION

1. Field of the Invention

The invention relates to the field of telecommunications and computer network cabling installations. More particularly, the preferred embodiment of the present invention relates to a device employed to identify various types of telecommunication and networking cables communicating from remote areas of an office or other building to a switch room within an office or building. Such identification is provided without the need to strip the distal ends of the wires or cables.

2. Description of the Related Art

Along with the boom of the Internet, the demand for telecommunications and computer networking infrastructure has also increased at a rapid rate. In commercial buildings and office buildings in particular numerous cables are often needed to connect the phone, computer, video, control, intercom, security, and fire alarm system cables from each office to the main systems and/or communications and networking lines entering the building.

A building's phone, computer, video, control, intercom, security, and fire alarm cabling is typically installed in a star topology. A star topology provides for one end of all of the cables to communicate from one location. Generally this location is a room designated as the telephone/computer room or switch room. The other ends of all of the cables communicating forth from the switch room terminate at different remote locations, such as each individual office or room where they engage with sockets adapted to connect phones or computers to the cable. For most cables both ends need to be electrically attached or "terminated" to a connector with type of connector determined by the cable's application. For example, most cables used for telephones and computer networks are terminated with a female modular, RJ type connector adapted to engage a male connector engaged to a computer or telephone. Such RJ connectors conventionally employed for this purpose are registered with the Federal Communications Commission.

During installation a first end of each cable is generally engaged with a socket adapted to engage the cable from a phone or computer to be located in a remote office. Such RJ sockets are conventionally located in walls. From this office termination point the cables are typically all routed to the switch room through conduits or circuitous routes where the distal ends of the many cables generally are left hanging down from the ceiling or wall outlet. The many distal ends of cables, each leading back to a termination point at some specific point in the building, must then be identified, properly labeled, and connected to the appropriate equipment. Current installation techniques require that the cables are terminated or finished in the switch room in some sort of alphanumeric order. Since the remote locations or offices or rooms usually have designated numbers, the room's phone, computer, video, control, intercom, security, and fire alarm cabling are usually identified using indicia which identify each cable's office or room termination to associate it with the specific room and/or portion of a room. In large offices or buildings with many rooms, the switch room can have hundreds if not thousands of individual cable distal ends, each communicating with individual terminating positions in individual rooms of the building.

Identifying each cable is conventionally a daunting and extremely time-consuming task. The conventional process of identifying each cable to allow the switch room distal end to be engaged to a connector or equipment which will communicate with the telephone or computer engaged to it at the terminating position in a room of the building is a painstakingly long and laborious task. The task generally involves two individuals, one at the switch room and one at the remote office, trying to locate the correct cables by the process of trial and error. To locate a cable the person at the remote office generally sends an electronic signal down the cable and the person in the switch room goes through the many cables hanging in the switch room, one by one, to detect the single cable having the signal. Once the signaling cable is located, it is labeled and the person in the remote office engages the signaling device with another cable or socket engaged to a cable. This new engagement of the signaling device sends the electronic signal down another cable and the person in the switch room sorts through the individual cables, one by one, with a signal detector to identify the single cable now carrying the transmitted signal. If hundreds of cables are present, the process of identifying each of the cables individually can take days to complete, as finding the connected cable with the signal is essentially determined by chance. The person in the switch room must use the signal detector on each cable in the switch room that is unidentified until the correct cable is found.

Further complicating the process is a lack of power in buildings and offices while the cables are being located. This is especially true in new construction and remodels of buildings. This prevents cables from being connected and identified by utilization of electricity to complete the circuit between the cables and any type of outlet box having connections for multiple cables. Some inventions have attempted to solve this problem of lack of power by having one person send a sound pulse down the cable at one end and another person use a pulse detection tool to detect the pulse in the cable at the other end. However, this can be a time-consuming process, as hundreds of wires must be individually scanned. Further, when relying on electronically transmitted signals, there exists the possibility of detecting a signal from the wrong cable if sensitive tools are not used. This is because the cables generally run along parallel paths from the remote rooms of the building to the switch room, and adjacent parallel cables can pick up the signal transmitted down an adjoining cable.

Other devices have tried to solve the problem of identifying one cable out of many cables by utilizing boards with rows and columns of cable connectors and lights. However, these devices have not had the capabilities to be used when the office or building does not have power, and they do not provide a rapid means to identify unstripped cables.

Thus, there is a current need for a quick, efficient, and cost-effective way to locate unconnected and unidentified telecommunication or computer networking cables within a location that does not rely on the electrical power within that location and that can accommodate both unstripped cables and cables having been stripped of their insulation.

With respect to the above, before explaining at least one preferred embodiment of the invention in detail, it is to be understood that the invention is not limited in its application to the details of construction and to the arrangement of the components or steps set forth in the following description or illustrated in the drawings. The various apparatus and methods of the invention are capable of other embodiments and of being practiced and carried out in various ways which will be obvious to those skilled in the art once they review this disclosure. Also, the phraseology and terminology employed herein are for the purpose of description and should not be regarded as limiting.

As such, those skilled in the art will appreciate that the conception upon which this disclosure is based may readily be utilized as a basis for designing of other devices, methods and systems for carrying out the several purposes of the present disclosed device. It is important, therefore, that the objects and claims be regarded as including such equivalent construction and methodology insofar as they do not depart from the spirit and scope of the present invention.

SUMMARY OF THE INVENTION

The device herein disclosed and described provides an easily employed cable identification device that allows for the quick determination of the identity of cable terminating at one end with reference to a termination point in an office or room of a building at the other end. The device as described and disclosed does not require special adapters for different types of cables being identified and does not require that the distal end of the cable be stripped of insulation for engagement to the device. Additionally, the device neither requires the installer in the switch room to hold any electronic devices while locating and labeling the cables, nor any electronic transmission devices to be employed by the second person in the remote room at the other end of the cable.

Still further, the device provides for visual identification of the individual cables using lights rather than audible identification using transmitted signals. Elimination of transmission of electronic audible tones provides the additional advantage of eliminating false signals on other directly adjacent cables and the resulting misidentification of cables. Using the device with individual visual identification of one of a plurality of device-engaged cables also allows the installer in the switch room to handle individual cables only twice, rather than sifting through a whole bundle of hundreds of cables each time a signal is sent from a remote location.

In a preferred embodiment of the device, a first component used in the switch room features a generally rectangularly shaped case with a top surface for engagement of LED's and cable engaging tubes, and also employs a carrying handle and a pair of mounting brackets. The device in a preferred embodiment includes a plurality of multiple hollow tubes, communicating with a top surface, each tube corresponding to an adjacent illumination means such as a light-emitting diode (LED). At the bottom end of each of the tubes, opposite their communication with the top of the case, is situated a pointed axial member such as a needle which is in direct or switched electrical communication with one lead from the adjacent corresponding LED. The other lead of the LED or illumination device is connected to one half of an electrical power source such as a battery. The LED thus always has power communicated to one terminal and is engaged at the other to the other half of the power source through the pointed axial member, directly, or using a means for switching which the axial member activates when an inserted cable completes the circuit.

An electrical connection is engaged between the other pole of the battery or other half of the electrical power source engaged to the LED or light and the building AC electrical ground circuit. Buildings in most industrialized countries use AC power which employs a pair of wires which provide AC power to every room of the building, and a third ground wire which is communicated to each and every electrical socket in each room of the building. As most such buildings employ a fuse or breaker box if the electrical power is turned off, there is a high probability that the two wires for carrying the AC current are disengaged at the breaker box. However, the ground wire is always in communication with the ground plug on each electrical socket in the building. Consequently, electrical communication between the other half of the power source for the LED, is in the preferred mode, communicated from the device to each such ground pin, of each individual AC receptacle, in the building.

Another key component of the device features an engagement cable. This engagement cable is employed by a person in the remote room and adapted at a first end to engage the ground receptacle of an AC socket. Conventionally, the ground receptacle accepts a male pin shaped quite differently than the receptacles carrying the AC current in order to prevent users from plugging in a device incorrectly or from getting an electrical shock. The engagement cable is thus adapted on a first end to plug into the ground receptacle and at the opposite end to engage the RJ female receptacle or other socket to which a cable is connected in the remote room. This engagement cable would be adapted to the task at hand such that if the cables being identified are network or telephone cables with multiple internal strands, the engagement cable would have the correct connector to plug into the network socket and the correct number of cables internally to match that of the socket. Each of the internal cables of the engagement cable would be electrically communicating with the ground pin which, of course, is shaped and sized to only engage into the ground pin of an AC electrical socket.

During a cable identification session, a user in the switch room inserts one end of a stripped or unstripped cable into one of the plurality of tubes and connects to the AC ground socket in a switch room. The other person, located in the remote building room, connects one end of the engagement cable to the ground socket in a remote room and plugs the other end, adapted to the sockets engaged with cables in the room, into one of the sockets. This closes the circuit to provide power to the LED or light adjacent to one of the many cables engaged into one of the plurality of tubes. As a result, a visual cue is provided as to the correct cable, out of the many engaged with the device, when the LED adjacent to the connected cable lights up. The person in the switch room can then properly label the identification of the connected cable. In a preferred option to the device, a second means to electrically connect the tube to a cable is provided in the form of conducting fibers such as steel wool located adjacent to the bottom of the tube and around the pin. This provides a second means to electrically engage the distal end of the cable in the switch room without the need to strip the insulation, since the distal ends of all strands of the cable are exposed and will make contact with the conducting fibers.

The electrical connection between the other half of the electrical power source such as a battery and the LED, providing an electrically detectible change only in one cable, can be accomplished by direct connection through the building ground wire, or, in a more favored embodiment of the device, by employing a switching means that detects a measurable electrical change in the wire having a completed connection through the building ground and returning down the cable being identified, which then connects the power to the other LED terminal to illuminate it. Employing such a switching means to complete the illumination of the LED can be accomplished using a switching means that detects micro currents in the cable or changes in resistance or impedance or capacitive measurements in the wire, or sensing any other measurable electrical changes in the cable being identified in one of the tubes, which only occur when the device electrically communicates through the building ground, through the engagement cable, and back to the device through the cable being identified. The employment of such a switching means that senses or detects an electrical change in the cable being identified and engaged in one of the tubes allows for a much lower voltage power source since it does not have to communicate electrical power entirely through the building ground and back to the LED. Those skilled in the art will no doubt realize that many means to detect an electrical change in the cable being identified that is communicated to it from the device, through the building ground, can be employed. All such switching means are anticipated herein.

An object of this invention is to provide a device to allow for visual identification of individual cables being identified without the need to sift through the cables one-by-one.

Another object of this invention is to provide such a device for identifying cables in a building that employs the existing building AC ground conductor as a means of communicating an electrically detectible change to a cable being identified.

An additional object of this invention is the provision of such a cable identification device which eliminates the need to strip the distal ends of the cables being identified.

A further object of this invention is the provision of a cable identification device that allows a user to engage a plurality of cables concurrently and then identify one cable visually from that plurality.

These together with other objects and advantages which become subsequently apparent reside in the details of the construction and operation as more fully hereinafter described and claimed, reference being had to the accompanying drawings forming a part thereof, wherein like numerals refer to like parts throughout. Further, there has thus been outlined rather broadly the more important features of the invention in order that the detailed description thereof may be better understood and in order that the present contribution to the art may be better appreciated. There are additional features of the invention that will be described hereinafter and which will form the subject matter of the claims appended hereto.

BRIEF DESCRIPTION OF THE DRAWINGS

The accompanying drawings which are incorporated in and form a part of this specification illustrate embodiments of the disclosed processing system and together with the description, serve to explain the principles of the invention.

DETAILED DESCRIPTION OF THE PREFERRED EMBODIMENTS

Figure 1:
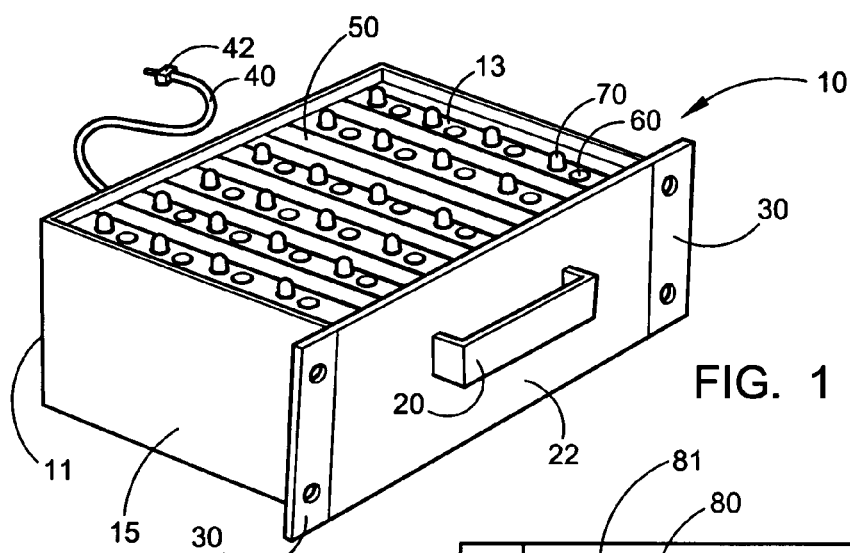
FIG. 1 depicts a front perspective view of the cable locating device, constructed in accordance with the present invention.

Referring now to the drawings FIGS. 1 through 8, wherein similar parts are identified by like reference numerals, there is seen in FIG. 1 a front perspective view of the cable locating device 10. Cable locating device 10 can be placed in a switch room on a table, shelf, or adapted for mounting in a conventional telecommunications relay rack. Cable locating device 10 is preferably a rectangularly shaped case 11 having an upper surface 13 surrounded by a sidewall 15. A carrying handle 20 may be provided and engaged with one surface such as the front surface 22 for easy transport. For ease of engagement with existing network equipment in a switch room, mounting brackets 30 located adjacent to front surface 22 can be provided. However, the device 10 will also function sitting on the floor or a table.

Means for electrical engagement of the device 10 with the ground circuit of an AC electrical system of a building is provided by grounding wire 40 extending from the device to an electrical communication with a pin 43 of a grounding plug 42. (see FIG. 2). Ground wire 40 in a favored version of the device 10 employs a grounding plug 42 at the distal end thereof adapted with a pin 43 for engagement only with a ground aperture of a conventional AC power outlet. As noted, such ground apertures in AC sockets in most of the industrialized world are shaped differently than the apertures in the socket carrying AC power. While other means to engage the distal end of the ground wire 40 with the building AC ground circuit may be employed such as an alligator clip, shaping the pin 43 of the ground plug 42 only to engage with the desired ground receptacle is preferred as it provides a means to prevent accidental engagement of the device 10 to AC power which might be accessible through AC wall sockets in the AC circuits of the building being wired. Additionally, the ground plug 42 may also have non-conductive pins 423 (See FIG. 7) formed of plastic or another non conducting material extending adjacent to the ground plug 42. The non-conducting pins 423 would be adapted in shape to engage within the apertures in an AC electrical socket that carry AC power. This means for non conductive engagement with the apertures engaged to the AC wiring of the building will provide more support and frictional engagement of the ground plug 42 with the AC receptacle during use, and also prevent workers from trying to force the pin 43 into the wrong receptacle aperture since all three of a standard 110 volt receptacle would be filled with projecting pins 43 and 423 from the ground plug 42.

Cable locating device 10 includes a plurality of hollow tubes 60 communicating through apertures 61 with the top surface 50 and located adjacent to a corresponding means for illumination such as the preferred lightemitting diode (LED) 70. LEDs 70 are preferred because of their low current draw and sturdy structure. The elongated hollow tubes 60 are adapted to accommodate insertion of the exterior circumference of various cables, including 1 pair to 6 pair, twisted or untwisted, shielded coaxial, or unshielded coaxial, up to the size of RG-6 quad shield. However, those skilled in the art will no doubt realize the tube 60 may be changed in dimension and shape to accommodate any type of cable and such is anticipated. Further, in a more Spartan embodiment of the device, the tube 60, while preferred, could be eliminated and the needles 62 (see FIG. 3) just mounted to a base to engage incoming cables being identified. However, the tubes 60 provide an excellent means for registering the incoming cables upon the needles 62 and holding them during the process.

Figure 2:
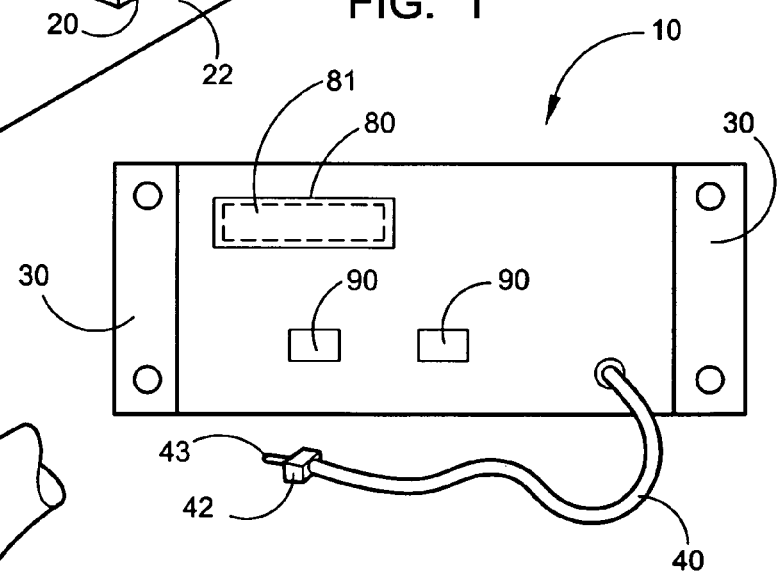
FIG. 2 depicts a rear view of the cable locating device, constructed in accordance with the present invention.

FIG. 2 depicts a rear view of cable locating device 10. This view depicts the location of a battery compartment 80 and two cable storage brackets 90 to allow for easy winding of the ground wire thereon. Mounting brackets 30 and ground wire 40 are also shown. It should be noted that the ground wire 40 may communicate through the rear surface or may plug into it by adapting the end closest to the device 10 with a plug to engage in an appropriately configured socket.

Figure 3:
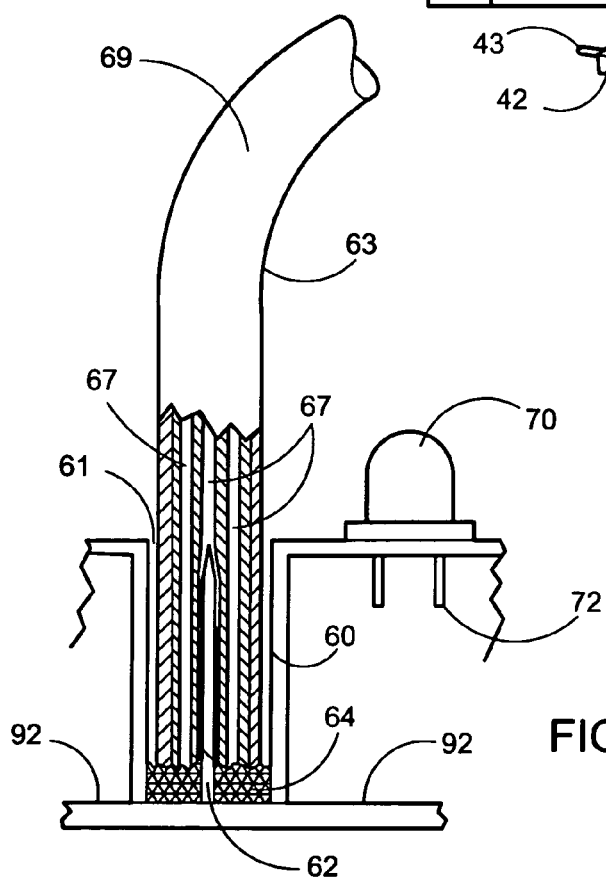
FIG. 3 depicts a partially cut away detailed view of the cable locating device, illustrating the cable tube and diode placement, constructed in accordance with the present invention.

Referring now generally to FIGS. 1-3. depicts a partially cut away internal view of cable locating device 10, illustrating the placement of hollow tube 60 wherein the aperture 61 communicates with the top surface 50 to allow insertion of the distal end of a particular cable 63 to be identified therein. Adjacent to the tube 60 is a corresponding LED 70 with the illumination end of the LED 70 positioned for easy visual identification above the top surface 50. The electrical connections providing power to illuminate the LED 70 are positioned within cable locating device 10.

Hollow tube and LED 70 are connected within cable locating device 10 to base 92 however other means for mounting these components can be employed. Hollow tube 60 contains a conductive member shown as needle 62 axially positioned along the center axis of the tube 60 extending from an endwall of the tube 60, or a connection with base 92 toward the aperture 61. This needle 62 provides a first means to electrically communicate with a particular insulated wire 63 inserted into the tube 60 without the need to strip insulation from that wire 63 or the plurality of smaller internal insulated wires 67 inside the wire 63 surrounded by an insulating sheath 69. The pointed distal end of the needle 62 will either directly engage the conducting metal of an inserted unstripped wire, or will pierce the insulation of one of multiple internal insulated wires 67 that are inside conventional twisted-pair style networking and telephone wires, or any cable with an external insulation layer covering multiple internal wires, thereby electrically communicating with at least one of the internal wires of a multi-cable insulated cable.

In a preferred embodiment of the device 10 a second means to electrically communicate with at least one conducting wire of an insulated cable inserted into the tube 60 is provided. While the needle 62 will work by itself in a more Spartan version of the device 10, employing this second means to communicate electrically with an insulated wire is preferable since it provides two means to communicate with the wire. This second means of electrical communication with an insulated wire is provided by electrically conductive resilient material such as compressible fabric 64 located in the bottom portion of hollow tube 60, surrounding a bottom portion of needle 62. This conductive material contacts the uninsulated cross sectional area of the wires 67 that is exposed when wires 67 are cut but not stripped of insulation. Conductive material can be any electrically conductive material that will compress and rebound to a non-compressed position, such as one or a combination of preferred materials of copper or steel wool, but might also be a conductive gel or a conductive liquid. Of course a more Spartan version of the device 10 might just employ the conductive compressible fabric 64 and not the needle 62 and attempt to electrically engage with the exposed center portion of the distal end of an electrical wire. However, providing both the needle 62 and the conductive compressible fabric 64 works best.

A corresponding LED 70 is positioned adjacent to each tube 60 and has two leads 72 for providing electrical power to the LED 70 to initiate illumination thereof. One lead 72 of LED 70 illumination device is connected to one half of an electrical power source such as a battery 81 or transformer. The other lead 72 of the LED is connected to the other half of the power source either through a means for switching that detects an electrical signal on the line being identified, or directly through "U" to the other half of the electrical power source such as the battery 81, through a means to communicate electrically using the building AC ground circuit to connect to the remote end of the wire being identified.

If a direct connection is employed between the power source such as battery 81 and the second lead 72 of the LED 70, as a means to communicate electrically using the building AC ground circuit, then the connection from "U" would communicate to the ground wire 40 and be communicated through the building ground circuit of the AC system when the plug 42 engages pin 43 into the ground wire of an appropriately dimensioned AC electrical socket to accept it. To connect the end of the cable being identified where it terminates at a socket in the remote location, with the output from "U" of the device, a patch cable (shown in FIG. 6-8) is adapted at a first end with a pin 43 dimensioned for engagement with a ground aperture of the conventional AC power socket in the remote location. The pin 43 would be best if it prevented engagement with any other wire aperture or engagement point in the AC socket to keep users from plugging it into a wire having AC electrical current. This shape adapted only to engage the ground aperture of the socket 322 thereby provides a means to prevent engagement of the patch cable 340 (see FIG. 6a) with building electrical wires carrying AC electrical current terminating at energized socket apertures 321.

The patch cable is employed to communicate the detectible electrical signal or reading transmitted from the device 10 from "U" when connected into the building AC ground wiring, to the other end of a cable being identified in the remote room. As noted, the remote end of the cable being identified is conventionally electrically engaged with a wall or floor mounted socket in the remote room. As such, the second end of the patch cable, opposite the pin 43 (also shown as 422 and 530 see FIGS. 7-8) which engages the building ground circuit, will have the appropriate means of engagement such as a male pin 510 RJ connector shown. This connector 510, adapted to engage with the socket engaged to the remote end of the wire being identified, will be wired to connect all the twistedpair or other internal wires of the cable being identified (if there are multiple wires inside an external insulating sheath) to the pin 43.

Once the patch cable is engaged between the building ground using pin 43 and the socket engaged to the remote end of the wire being identified, the circuit would then be completed by one of the internal wires of the cable being identified which communicates either electrical current through either or both of the pin 62 or fabric 64 and to the other lead 72 of the LED 70 to illuminate it.

Figure 4:
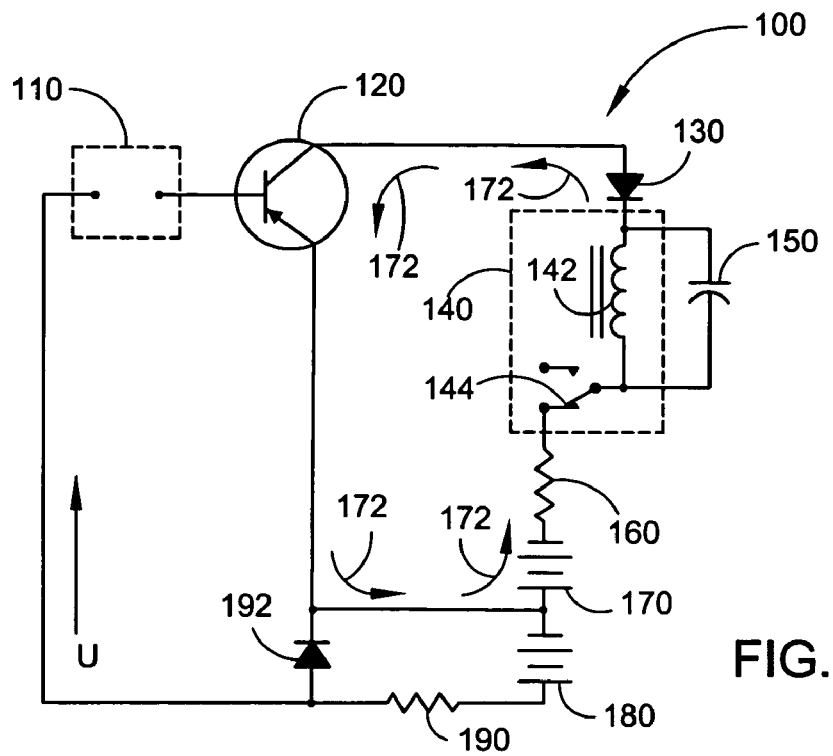
FIG. 4 depicts a schematic diagram of the cable locating device circuitry, constructed in accordance with the present invention.

Alternatively, in a preferred embodiment of the device 10, if a detectible signal is sent from "U" though the building ground and communicated through the patch cable to the remote end of the wire being identified, a means for switching to connect current from the power source to the corresponding LED 72 would close, thereby illuminating the LED 70. One such means for switching is depicted in FIG. 4, which features a circuit that detects the completed connection of an electrical output from the device 10, through the building AC ground, to the remote end of the cable being identified in a tube 60 adjacent to a corresponding LED 70. The depicted means for switching would connect the other lead 72 of the LED 70 to the power source or battery 81 when it detects micro currents in the cable being identified. Other means for switching can be employed that closes the circuit between the power source or battery 81 and the other lead of the LED when some detectible electrical change is detected in a cable being identified in a tube 60. Such means for switching can be activated by software which closes the circuit in response to changes in resistance or impendence or capacitive or other electrical measurements in the cable being identified, or by a circuit which causes a closing of a switch such as a transistor when a detectible electrical change generated by the device is received on a cable being identified. Any such current, electrically detectible signal or change would be generated by the device 10 and communicated in the aforementioned fashion through the building ground, through the patch cable, to the remote end of the cable being identified to thereby illuminate an LED next to the tube 60 in which the cable being identified is engaged.

FIG. 4 as noted depicts a schematic diagram 100 of a means for switching the LED to illuminate which can be included in the cable locating device 10. As shown it would be connected to a remote outlet location 110 using the building AC ground circuit and employing a means for communicating electrical power to the second lead on the LED 70 when an electrical current is sensed in one cable being identified and engaged in an adjacent tube 60. The device 10 is engaged to the building ground using wire 40 as noted, and the appropriately adapted patch cord 340,350, 520, 416, (see FIGS. 6-8) is engaged in the remote location 110 between the AC ground of the AC socket and the socket engaging the remote end of the cable being identified. The switching means in this preferred embodiment of the device 10 employs transistor 120, resistor 190, and operatively engaged to battery 180 or 81 to form a bias circuit to actuate transistor 120. Once the circuit is closed by the engagement of the patch cable between a ground aperture of a conventional AC power outlet in a remote location 110, and the socket engaging the remote end of the cable being identified, transistor 120 allows current to flow (shown by arrows 172) from battery 170 through a voltage limiting resistor 160. The current then energizes a coil 142 in a relay 140, which is normally on, a capacitor 150, and an LED 130, causing LED 130 to light up. After coil 142 becomes fully energized, pole 144 opens the circuit, causing LED 130 to turn off. When capacitor 150 fully drains, pole 144 switches back to the closed position, causing the circuit to be closed, coil 142 to be energized, and LED 130 to be lit again. A micro current communicating though the building ground to the remote end of the cable being identified is enough to switch the LED to an illuminated condition. Of course other software or hardware controlled means for switching to connect the LED to a power source 81 can be employed as noted above as long as the sensed electrical signal or changed electrical measurement in the line being identified can be generated by the device 10 and communicated through the building ground in the aforementioned fashion.

Figure 5:
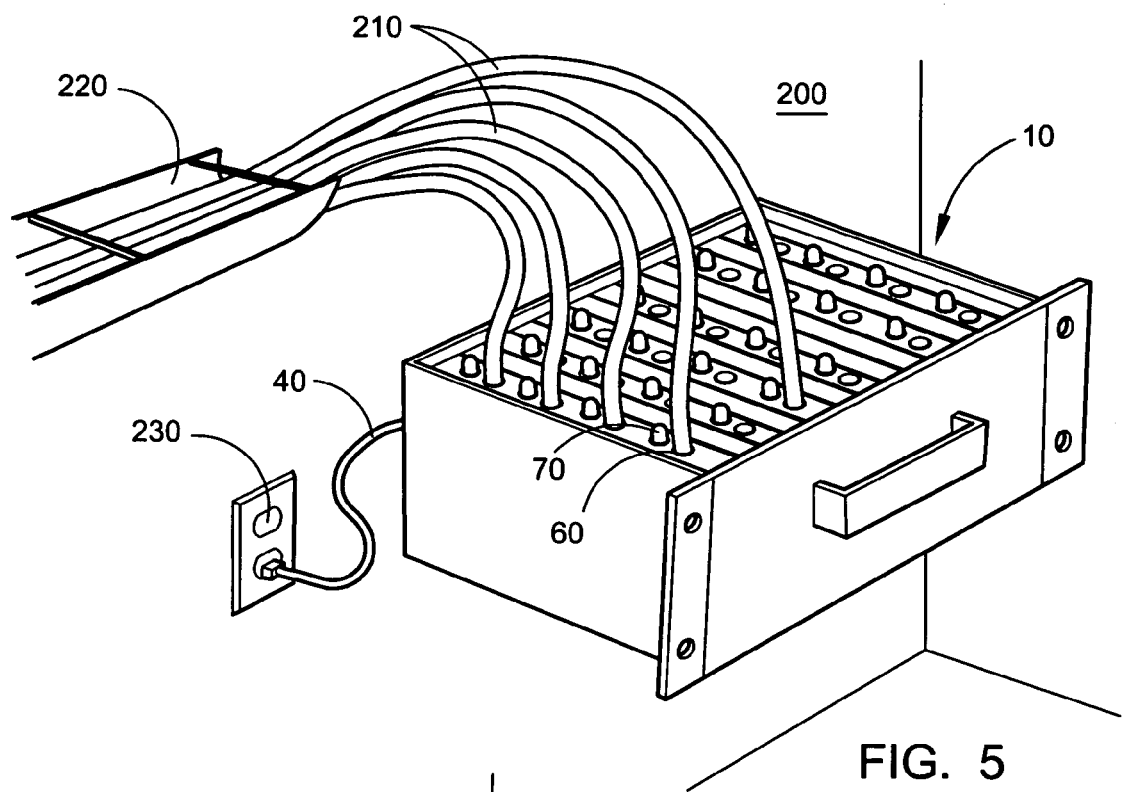
FIG. 5 depicts a front perspective view of the cable locating device connected within a switch room, constructed in accordance with the present invention.

FIG. 5 depicts a front perspective view of cable locating device 10 connected within a switch room 200. A switch room 200 can be any room where networking cables or telecommunications cables or other low voltage cables used for communication terminate at ends distal from various remote locations. Depicted in this figure, cables 210 extending from cable holder 220 are engaged within hollow tubes 60 located within cable locating device 10, and grounding wire 40 is connected to the ground lug of AC outlet 230, thus forming an electrical circuit back to the cable being identified when the patch cable is engaged in the remote location as noted above.

Figure 6:
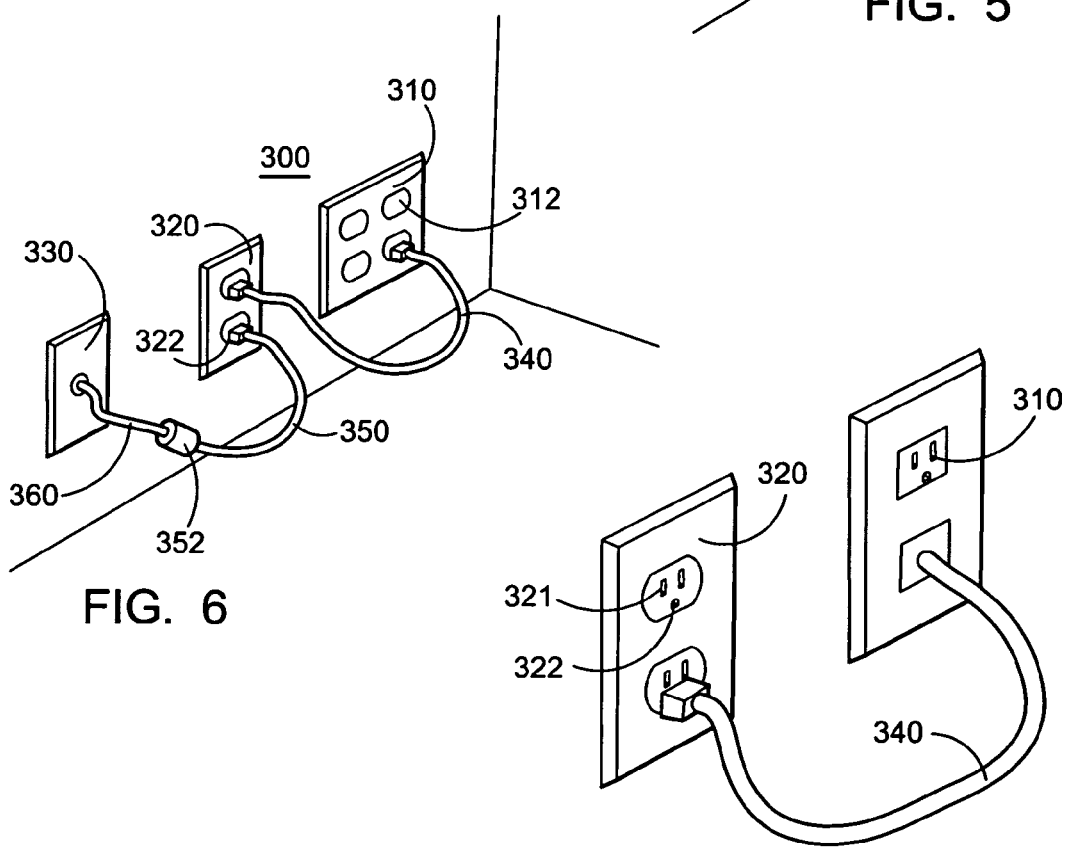
FIG. 6 depicts a front perspective view of the grounding wire device and a four-pair modular or eight pair modular a patch connector, operatively to an outlet in a remote room, constructed in accordance with the present invention.
Figure 6A:
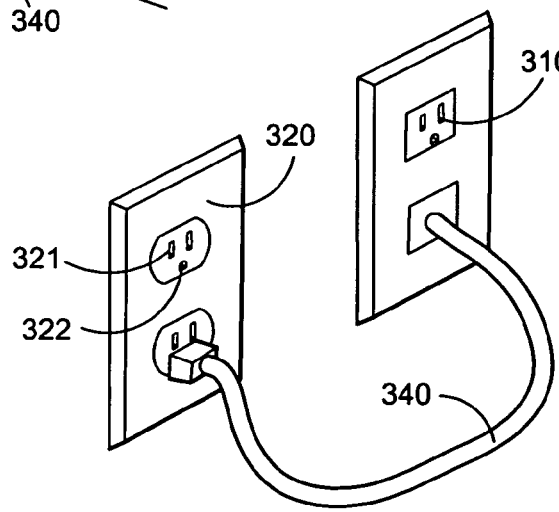
FIG. 6a depicts an enlarged view of the socket and patch connector of the present invention.

FIGS. 6 and 6a depict views of a four-pair or eight-pair modular patch cable 340 and a ground wire device 350 of similar function, connected to a standard AC power outlet 320 in a remote location 300. Patch cable 340 is used to engage with the socket connected to a cable needing identification within a wall. Patch cable 340 has one end that can connect into a category 5 socket 310 and another adapted to engage with the ground receptacle or plug 322 of the AC power outlet 320. Ground wire device 350 is used to identify stripped cables that are not part of an outlet. A patch connector 350 may be used to engage with the remote end of cables needing identification if they are not engaged to a wall mounted socket 310 at the remote location 110. This patch connector has a connector portion 352 on one end (see also FIG. 7) that allows an un-stripped cable 360 coming out of a wall hole 330 to be electrically and physically connected with patch connector 350. The other end of patch connector 350 has a ground pin (see FIG. 7) adapted to engage with the ground of an AC power outlet ground plug 322. As noted the patch cable 340 and patch connector 350 can be fitted with non-conductive pins adjacent to the ground pin for a better engagement with the AC power outlet and to keep users from trying to insert the ground pin in the wrong socket aperture.

Figure 7:
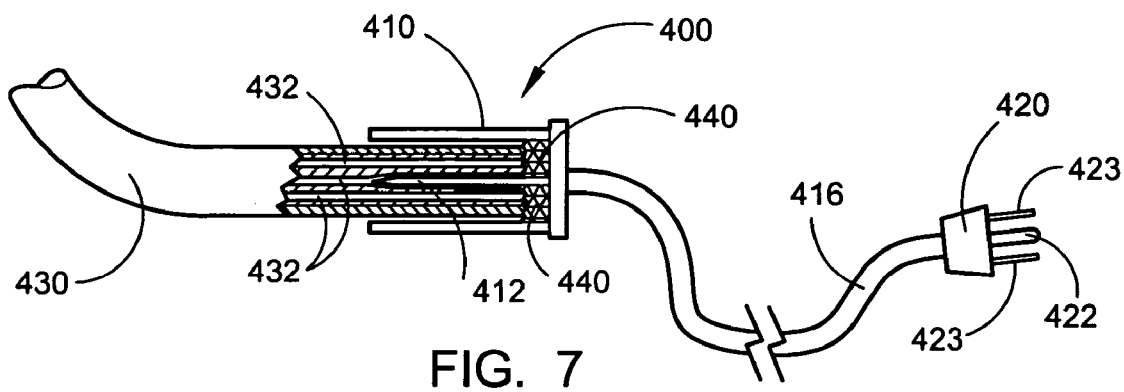
FIG. 7 depicts a detailed side view of a grounding wire device, constructed in accordance with the present invention.

FIG. 7 depicts a view of a ground wire device 400 for use with a stripped cable 430 as shown as 350 in FIG. 6. Ground wire device 400 includes a connector tube 410 having a needle 412 located therein. Conductive particles 440 are located within the innermost portion of connector tube 410, surrounding needle 412, to provide electrical connection between cable 430 and connector tube 410. Cable 430 contains individual cables 432 that also surround needle 412 when situated within connector tube 410. Ground wire device 400 also includes a connection wire 416 that connects connector tube 410 with ground pin portion 420. Ground pin portion 420 contains a ground pin connector 422 that is adapted to fit within a ground hole socket in a standard power outlet (not shown).

Figure 8:
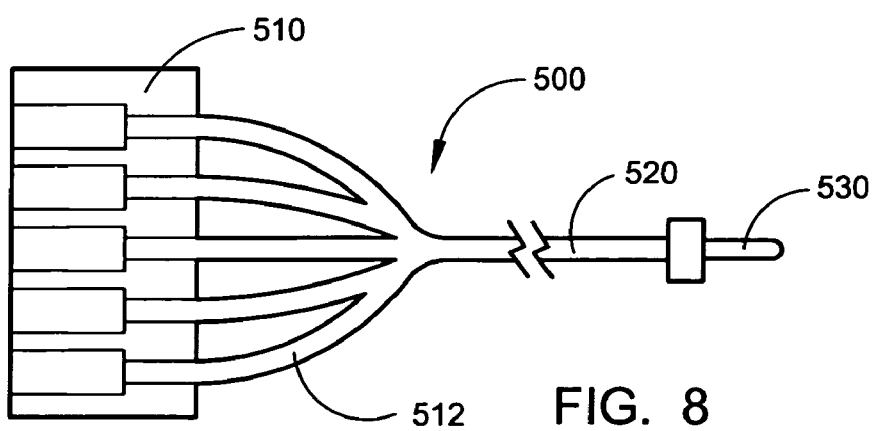
FIG. 8 depicts a detailed side view of a category 5 patch connector, constructed in accordance with the present invention.

FIG. 8 depicts a detailed side view of a category 5 patch connector 500 which would be employed as the patch cable 340 in the remote location 110. Patch connector 500 includes a male RJ connector 510, a wire 520, and a ground pin 530 adapted to engage the ground aperture of an AC socket and not the AC power carrying apertures. Optional non-conducting pins may also be provided as noted earlier. Connector 510 includes a plurality of connector wires 512 all of which electrically connect to wire 520 leading the building ground when the ground pin 530 is engaged. Connector 510 and can be plugged into any standard category 5 outlet and electrically communicate the building ground wire, with all of the internal wires of the cable being identified which engaged with a socket engaged by connector 510.

The device herein shown in the drawings and described in detail herein disclose arrangements of elements of particular construction and configuration for illustrating preferred embodiments of structure of the present invention. It is to be understood, however, that elements of different construction and configuration and different steps and process procedures and other arrangements thereof, other than those illustrated and described, may be employed for providing a cable locating device formed thereof in accordance with the spirit of this invention.

As such, while the present invention has been described herein with reference to particular embodiments thereof, a latitude of modifications, various changes and substitutions are intended in the foregoing disclosure, and it will be appreciated that in some instances some features of the invention could be employed without a corresponding use of other features, without departing from the scope of the invention as set forth in the following claims. All such changes, alternations and modifications as would occur to those skilled in the art are considered to be within the scope of this invention as broadly defined in the appended claims.

Further, the purpose of the foregoing abstract is to enable the U.S. Patent and Trademark Office and the public generally and especially the scientists, engineers, and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

What is claimed is:

1. A device for identifying cables within an office or building comprising:
    a plurality of means for receiving a distal end of a cable, each of said plurality engaged to a mounting surface;
    each of said plurality of means for receiving a distal end of a cable, having means to electrically communicate with a cable engaged therewith;
    a plurality of means for visual identification, each of said plurality of means for visual identification corresponding to a single one of said means for receiving a distal end of a cable;
    each said means for visual identification having a static state and having an active state visually identifiable from the rest of said means for visual identification in said static state;
    means to generate an electrical signal;
    a connection wire electrically engageable at a first end to said means to generate an electrical signal, and adapted at a second end for an electrical engagement with the ground circuit of the AC power supply installed in said building;
    a second connection wire configured at a first end for an electrical engagement with a remote ground receptacle electrically communicating with said ground circuit;
    said second connection wire having a second end, said second end of said second connection wire configured for an electrically engageable connection with a remote end of said cable;
    means to activate each said means for visual identification having an electrical communication with each respective means to electrically communicate with a cable, said means to activate changing a respective said means for visual identification to said active state, only when said electrical signal is communicated through said ground circuit to said remote end of a respective said cable engaged with said corresponding single one of said means for receiving said distal end of said cable; and
    whereby a particular said cable, out of a plurality of said cables, is visually identifiable, when engaged with a respective said means for receiving a distal end of a cable, by a resulting change to said active state, of a corresponding one of said means for visual identification.

2. The device for identifying cables within an office or building of claim 1, wherein said means to electrically communicate with a cable comprises:
    a needle having a first end engaged with a said mounting surface and a distal end.

3. The device for identifying cables within an office or building of claim 1, wherein said means for receiving a distal end of a cable comprises:
    a hollow tube, having a base portion on one end and an opening at an opposite end, said opening adapted to receive said cables therethrough.

4. The device for identifying cables within an office or building of claim 3, wherein said means to electrically communicate with a cable comprises:
    a needle axially engaged within said tube, said needle having a first end rising from said base portion and having a distal end adapted to electrically communicate with said distal end of said cable engaged in said tube.

5. The device for identifying cables within an office or building of claim 4 wherein said distal end is pointed thereby providing means to pierce electrical insulation.

6. The device for identifying cables within an office or building of claim 3 further comprising resilient conductive material positioned within each of said plurality of hollow tubes, said conductive material providing means to electrically communicate with said distal end of said cable through contact with an uninsulated cross-section of the tip of said cable.

7. The device for identifying cables within an office or building of claim 4 further comprising resilient conductive material positioned within each of said plurality of hollow tubes, said conductive material providing a second means to electrically communicate with said distal end of said cable through a contact with an uninsulated cross-section of the tip of said cable.

8. The device for identifying cables within an office or building of claim 5 further comprising resilient conductive material positioned within each of said plurality of hollow tubes, said conductive material providing a second means to electrically communicate with said distal end of said cable through a contact with an uninsulated cross-section of the tip of said cable.

9. The device for identifying cables within an office or building of claim 8, wherein said resilient conductive material is comprised of steel wool.

10. The device for identifying cables within an office or building of claim 1, wherein said plurality of means for visual identification comprises;
    a plurality of light-emitting diodes;
    an electrical power source; and
    said light emitting diodes operatively communicating with said electrical power source and changing to said active state, only when said electrical signal is communicated through said ground circuit to a respective said remote end of said cable engaged with said corresponding one of said means for receiving said distal end of said cable.

11. A device for identifying individual cables each having a distal end terminating in a first location and remote ends terminating at a communication socket located in remote rooms within an office or building comprising:
  a) a housing, said housing having an interior region and having a top surface,
  b) a plurality of hollow tubes engaged with said top surface, each of said tubes having an aperture at one end adapted to allow communication of a cable into said tube, and having a base portion on an opposite end, adapted to electrically communicate with said cable when inserted in said tube;
  c) a plurality of means for light transmission engaged with said housing, each corresponding to an individual one of said plurality of hollow tubes;
  d) an electrical power source;
  e) each of said means for light transmission having an illuminated state when engaged to said electrical power source, and a static state;
  f) means to communicate a detectible electrical measurable electrical signal;
  g) each of said base portion of said tubes communicating with a means to connect said electrical power source to a respective said corresponding means for light transmission;
  h) each of said means to connect said electrical power source having a closed state communicating power to a respective means for light transmission, said closed state occurring only when said electrical signal is communicated by a cable communicating with said base portion of a respective tube;
  I) a connection wire electrically engaged at a first end to said means to communicate a detectible electrical measurable electrical signal and adapted at a second end to an electrical engagement with the ground circuit of a building AC power supply;
  j) a second connection wire adapted at a first end for electrical engagement with a remote ground receptacle electrically communicating with said ground circuit;
  k) said second connection wire having a second end electrically communicating with said first end of said second connection wire, said second end of said second connection wire adapted for electrical engagement with a respective said communication socket; and
  whereby a particular cable, of a plurality of said cables in said first location is visually identifiable when said means for light transmission corresponding to one of said tubes in which said particular cable is engaged, changes to said illuminated state when said means to connect said electrical power source changes to said closed state in response to receiving said electrical signal communicated through said ground circuit to said distal end of said particular cable.

12. The device for identifying individual cables of claim 11 wherein said base portion adapted to electrically communicate with said cable when inserted in said tube comprises:
  a needle axially positioned within each of said plurality of hollow tubes;
  said needle formed of conductive material; and
  said needle having a first needle end coupled to said base portion and having a second needle end adapted to pierce insulation on said wire, whereby insulation on a wire inserted in said tube will be pierced by said needle to allow electrical communication therewith.

13. The device for identifying individual cables of claim 11 wherein said base portion adapted to electrically communicate with said cable when inserted in said tube comprises:
  resilient conductive material positioned adjacent and in electrical communication with said base portion of each of said plurality of hollow tubes; and
  said conductive material providing means to electrically communicate with said distal end of said cable inserted in said tube through a contact with an uninsulated cross-section of the tip of said cable.

14. The device for identifying individual cables of claim 12 wherein said base portion adapted to electrically communicate with said cable when inserted in said tube comprises:
  resilient conductive material positioned adjacent to said first end of said needle and in electrical communication with said base portion of a respective one of each of said plurality of hollow tubes; and
  said conductive material providing a second means to electrically communicate with said distal end of said cable inserted in said tube through a contact with an uninsulated cross-section of the tip of said cable.

15. The device for identifying individual cables of claim 14 wherein said resilient conductive material is one or a combination of materials consisting of steel wool or copper wool.

16. The device for identifying individual cables of claim 11 further comprising:
  said cables having a plurality of twisted-pairs of insulated wires surrounded by an insulating jacket;
  said communication socket located in said remote rooms being telecommunications sockets having a plurality of terminating pins in communication with individual said insulated wires of said twisted pairs;
  said second connection wire adapted at a first end with a plug having a conducting prong adapted to only engage with the ground socket of an AC standard power outlet having said ground socket and having adjacent energized sockets thereby providing means to prevent engagement of said first end of said second connection wire, with said energized sockets;
  said second connection wire having a second end adapted for electrical engagement with a plurality of individual electrical connections each of said individual electrical connections respectively communicating with one of said terminating pins of said telecommunications socket;
  said prong electrically communicating with each of said individual connections; and
  whereby said electrical signal is communicable through said ground circuit and through said second connection wire to each said wire of said plurality of twisted-pairs of wires in communication with said terminating pins of said telecommunications socket at said remote end of said particular cable and to said base portion of a respective tube engaged with said distal end of said particular cable to cause illumination of said corresponding means for light transmission.

17. The device for identifying individual cables of claim 12 further comprising:
  said cables having a plurality of twisted-pairs of insulated wires surrounded by an insulating jacket;
  said cables having a plurality of twisted-pairs of insulated wires surrounded by an insulating jacket;

said communication socket located in said remote rooms being telecommunications sockets having a plurality of terminating pins in communication with individual said insulated wires of said twisted pairs;

said second connection wire adapted at a first end with a plug having a conducting prong adapted to only engage with the ground socket of an AC standard power outlet having said ground socket and having adjacent energized sockets thereby providing means to prevent engagement of said first end of said second connection wire, with said energized sockets;

said second connection wire having a second end adapted for electrical engagement with a plurality of individual electrical connections each of said individual electrical connections respectively communicating with one of said terminating pins of said telecommunications socket;

said prong electrically communicating with each of said individual connections; and whereby said electrical signal is communicable through said ground circuit and through said second connection wire to each said wire of said plurality of twisted-pairs of wires in communication with said terminating pins of said telecommunications socket at said remote end of said particular cable and to said base portion of a respective tube engaged with said distal end of said particular cable to cause illumination of said corresponding means for light transmission.

18. The device for identifying individual cables of claim 14 further comprising:

said cables having a plurality of twisted-pairs of insulated wires surrounded by an insulating jacket;

said cables having a plurality of twisted-pairs of insulated wires surrounded by an insulating jacket;

said communication socket located in said remote rooms being telecommunications sockets having a plurality of terminating pins in communication with individual said insulated wires of said twisted pairs;

said second connection wire adapted at a first end with a plug having a conducting prong adapted to only engage with the ground socket of an AC standard power outlet having said ground socket and having adjacent energized sockets thereby providpg means to prevent engagement of said first end of said second connection wire, with said energized sockets;

said second connection wire having a second end adapted for electrical engagement with a plurality of individual electrical connections each of said individual electrical connections respectively communicating with one of said terminating pins of said telecommunications socket;

said prong electrically communicating with each of said individual connections; and whereby said electrical signal is communicable through said ground circuit and through said second connection wire to each said wire of said plurality of twisted-pairs of wires in communication with said terminating pins of said telecommunications socket at said remote end of said particular cable and to said base portion of a respective tube engaged with said distal end of said particular cable to cause illumination of said corresponding means for light transmission.

19. The device for identifying cables within an office or building of claim 18, wherein said housing further comprises at least two mounting brackets coupled to said top surface, said mounting brackets adapted for attachment of said housing to a telecommunications relay rack.

20. The device for identifying cables within an office or building of claim 1 wherein said means to activate each said means for visual identification changes to said active state in response to said electrical signal, said electrical signal being one of a group of detectible electrical signals including a voltage, a resistance, and an impedance.

21. A method for identifying a cable within an office or building employing a cable identifying device, having at least one means for communicating an electrical signal, at least one means for electrically engaging a distal end of said cable, at least one means for visually signaling receipt of said electrical signal in electrical communication with a corresponding said means for electrically engaging said distal end of said cable;

electrically engaged to said, a connection cable adapted on a connecting end to electrically engage a first ground socket of an AC power outlet in said building and communicating at a second end with said means for communicating an electrical signal, a cable connector adapted at a first end to electrically engage a remote end of said cable and adapted at a second end to electrically engage a second ground socket of a second AC power outlet where said second ground socket communicates with said first ground socket through the ground circuit of AC wiring installed in said building, comprising the steps of:

a) connecting said distal end of said cable to said means for electrically engaging said distal end of said cable;

c) engaging said connection end of said connection cable with said first ground socket;

c) connecting said first end of said cabled connector to said remote end of said cable;

d) connecting said second end of said cabled connector to said second ground socket of said second AC power outlet;

e) communicating said electrical signal through said connection cable to said ground circuit and through said cabled connector to said distal end of said cable; and f) identifying an individual one said cable by visually identifying said means for visually signaling receipt of said electrical signal corresponding with said individual one said cable.

* * * * *